United States Patent [19]

Moore, Jr.

[11] Patent Number: 4,575,687

[45] Date of Patent: Mar. 11, 1986

[54] VOLTAGE ADJUSTABLE CAPACITANCE FOR FREQUENCY RESPONSE SHAPING

[75] Inventor: Chester A. Moore, Jr., Bartlett, Ill.

[73] Assignee: Gould Inc., Rolling Meadows, Ill.

[21] Appl. No.: 656,209

[22] Filed: Oct. 1, 1984

[51] Int. Cl.$^4$ ............................................. H03F 3/45
[52] U.S. Cl. ................................... 330/261; 330/252
[58] Field of Search ............. 330/252, 254, 261, 278, 330/307; 307/320, 321; 333/214

[56] References Cited

U.S. PATENT DOCUMENTS

| | | | |
|---|---|---|---|
| 3,660,773 | 5/1972 | Free | 330/261 X |
| 3,796,963 | 3/1974 | Balaban | 329/101 X |
| 3,852,688 | 12/1974 | Takeda | 329/204 X |
| 4,288,754 | 9/1981 | Okada et al. | 330/260 |
| 4,306,198 | 12/1981 | Okada | 330/260 |
| 4,322,688 | 3/1982 | Schlotzhauer et al. | 330/252 |
| 4,340,866 | 7/1982 | Metz | 330/254 |

Primary Examiner—Eugene R. LaRoche
Assistant Examiner—Steven J. Mottola
Attorney, Agent, or Firm—John R. Garrett; Edward E. Sachs

[57] ABSTRACT

This disclosure depicts a substantially constant capacitance circuit for use with an external circuit having a variable voltage signal across first and second terminals. The circuit produces a constant capacitance across the terminals as the voltage signal varies. The value of capacitance is adjustable. The capacitance circuit comprises a first variable voltage source having its positive terminal operatively connected to the first terminal and a second variable voltage source having its positive terminal operatively connected to the second terminal. First, second, third and fourth reverse biased diodes are provided. The first diode is connected across the first voltage source and the fourth diode is connected across the second voltage source. The second diode is connected from one side of the first voltage source to the opposed side of the second voltage source and the third diode is connected between the first and second voltage sources in an opposite configuration to the second diode. The first, second, third and fourth diodes are connected to be reversed biased by the variable voltage signal and by the first and second voltage sources. The substantially constant capacitance circuit provides a substantially constant equivalent capacitance across the first and second terminals of the external circuit as the level of the variable voltage signal changes.

11 Claims, 6 Drawing Figures

VOLTAGE ADJUSTABLE CAPACITANCE FOR FREQUENCY RESPONSE SHAPING

BACKGROUND OF THE INVENTION

The present invention pertains in general to circuits which produce a capacitance across a pair of terminals wherein the capacitance remains constant as a voltage signal across the terminals varies and, in particular, to circuitry for maximizing the bandwidth of a transconductance amplifier while minimizing overshoot. The present invention also provides for adjusting the value of capacitance across the terminals of the circuit.

Transconductance amplifiers are high precision wide band amplifiers which have broad application in modern electronic equipment. The transconductance amplifier is an amplifier in which a voltage is supplied as an input and a current results as an output. Further circuitry then produces an output voltage based on this output current. It is desirable to maximize the bandwidth of the amplifier as much as possible. It is known in the prior art that this can be achieved by adding a capacitor C1 across the gain setting resistor R1 as shown in FIG. 1. In terms of LaPlace transforms this addition of the capacitor C1 has the effect of adding a zero to the numerator in the LaPlace transform for the amplifier. As a result the frequency response to the amplifier is shifted from the curve 10 to the curve 12 shown in FIG. 2. This approach however also introduces overshoot 14 on the frequency response curve 12.

Furthermore, an additional problem in fabrication techniques occurs when the capacitance is provided across the gain setting resistor. When the transconductance amplifier is formed as an integrated circuit chip, the characteristics of the amplifier vary from one chip to the next. Thus it is necessary to use different values of capacitance for each amplifier. In the prior art, one method is to provide a capacitor on a printed circuit board which may be manually removed and replaced with capacitors of different values until the appropriate results are achieved. A drawback with this technique is that a series inductance is introduced between the capacitor and the resistor when the rest of the transconductance amplifier is part of the integrated circuit chip while the capacitor is a separate part on the printed circuit board. The series inductance produces undesirable effects in the circuit.

The present invention overcomes these drawbacks in the prior art.

SUMMARY OF THE INVENTION

The present invention involves a substantially constant capacitance circuit for increasing the frequency response of a transconductance amplifier having a predetermined gain. The circuit comprises a receiving means for accepting an input voltage and for producing an output voltage in response to the input voltage. A means for setting the gain of the transconductance amplifier is provided and is operatively connected to the means for receiving the input voltage. In the transconductance amplifier the means for receiving is a pair of semiconductor transistors in which the emitters of the transistors are coupled together through a gain setting resistor. Four voltage controlled reversed biased diodes are provided in a series parallel circuit configuration which is connected to the emitters of the transistors. The diodes are unaffected by changes in the level of the input voltage. Conventional voltage controlled capacitors (varactors) have a capacitance which is sensitive to the input signal amplitude. These capacitors vary in capacitance as a function of the DC level of the AC signal. This invention allows the capacitance to be controlled, but the capacitance does not substantially change as the DC level of the AC signal changes. The invention includes a signal independent voltage controllable capacitor. A variation in the voltage across the reversed biased diodes by separate voltage sources causes the associated capacitance of the diodes to change thereby controlling the frequency response increase of the transconductance amplifier.

OBJECTS OF THE INVENTION

It is a general object of the present invention to provide a circuit which produces a substantially constant capacitance across a pair of output terminals when a varying voltage signal is present on the terminals.

It is another object of the present invention to provide a circuit in which the value of the capacitance produced on the terminals is adjustable.

It is a further object of the present invention to provide an adjustable constant capacitance circuit which is suitable for use in an integrated circuit chip.

It is yet another object of the present invention to provide an adjustable constant capacitance circuit which is reliable and economical to manufacture.

BRIEF DESCRIPTION OF THE DRAWINGS

The features of the present invention which are believed to be novel are set forth with particularity in the appended claims. The invention together with further objects and advantages may best be understood by reference to the following description taken in conjunction with the accompanying drawings, in the several figures of which like reference numerals identify like elements, and in which:

DESCRIPTION OF THE PREFERRED EMBODIMENT

Figure 3:
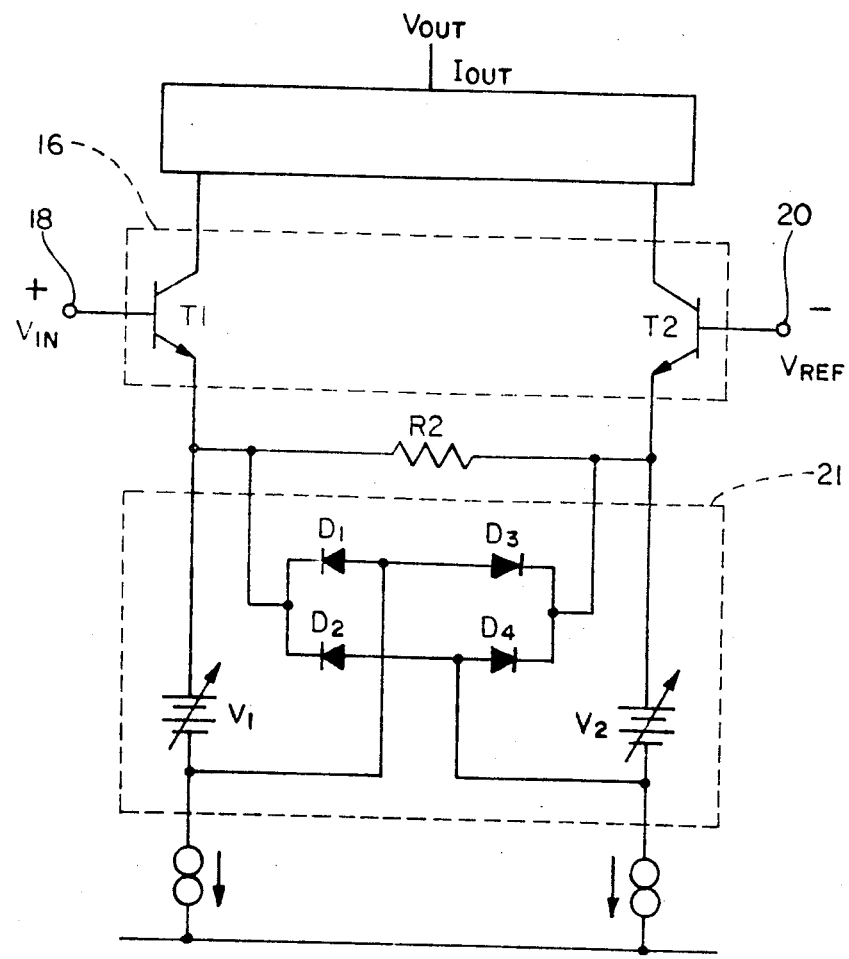
FIG. 3 is a schematic drawing of an electronic circuit embodying the present invention.

The novel electronic circuit shown in FIG. 3 is useful for extending the frequency response of a transconductance amplifier, as well as, other applications. With the use of this circuit the bandwidth of the amplifier is maximized while minimizing overshoot. Furthermore, the adjustable capacitor used in the transconductance amplifier increases the bandwidth of other circuitry connected to the collectors of T1 and T2. The invention is useful for inducing a variable capacitance on an integrated circuit chip through the use of two pairs of diodes in series and in parallel with one another.

In general terms an adjustable circuit for increasing the frequency response of a transconductance amplifier having a predetermined gain is provided. The circuit comprises a means for receiving an input voltage and a means for producing an output voltage in response to said input voltage. The means for producing an output voltage is operatively connected to the means for receiving. The circuit also comprises a means for setting the gain of the transconductance amplifier which is operatively connected to the means for receiving and a variable means for increasing the frequency response of the transconductance amplifier. The variable means is operatively connected to the means for receiving and is unaffected by changes in the level of the input voltage. In the preferred embodiment shown in FIG. 3 the variable means for increasing the frequency response of the transconductance amplifier is voltage controlled and comprises at least four voltage controlled reversed biased diodes.

In the FIG. 3 circuit the means for receiving 16 has a positive input terminal 18 for receiving the input voltage and a negative input terminal 20 for receiving a reference voltage, or both terminals 18 and 20 may receive the input voltage. The positive input terminal 18 is operatively connected to a first semiconductor means or transistor T1 and the negative input terminal 20 is connected to a second semiconductor means or transistor T2. In the preferred embodiment transistors T1 and T2 have their emitters connected together through a resistor R2 which is the means for setting the gain of the transconductance amplifier. The variable means 21 for increasing the frequency response comprises a first variable voltage source V1 which is operatively connected to the emitter of transistor T1 and a second variable voltage source V2 which is operatively connected to the emitter of the second transistor T2. Furthermore, the variable means 21 comprises first, second, third and fourth reversed biased diodes D1, D2, D3 and D4. The first diode D1 is connected across the first voltage source V1 and the fourth diode D4 is connected across the second voltage source V2. The second diode D2 is connected from one side of the first voltage source V1 to the opposed side of the second voltage source V2. The third diode D3 is connected between the first and second voltage sources V1 and V2 in an opposite configuration to the second diode D2. The first, second, third and fourth diodes D1, D2, D3, and D4 are connected to be reversed biased by the input voltage, the reference voltage or negative input and the first and second voltage source V1 and V2 as shown in FIG. 3. The first and second voltage sources V1 and V2 are adjustable such that changes in both voltage sources V1 and V2 produce equal voltage levels. The circuit 21 may have other applications where a constant capacitance is necessary when a varying signal is present on the terminals of the circuit 21.

The diode arrangement disclosed in FIG. 3 is unaffected by changes in the level of the input voltage, that is, the capacitance value of the reversed biased diode circuit does not change with changes in the input voltage. If the voltage at the emitter of T1 changes as a result of an increase in voltage at the positive input terminal 18, the voltage across diodes D1 and D4 will stay the same while the voltage across diode D3 will increase and the voltage across diode D2 will decrease in proportion to one another. Thus any change in voltage from the input signal of the transconductance amplifier will be cancelled out by the action of diodes D2 and D3 thereby producing a constant capacitance across the resistor R2. The capacitance produced by the diodes D1–D4 may be changed by adjusting voltage sources V1 and V2. If the voltage source V1 and V2 are increased in voltage by the same amount at the same time the voltage across the four diodes D1L–D4 increases by the same amount for each diode. This increase in voltage across each of the diodes results in a decrease in the capacitance of the diodes. Thus all four diodes D1–D4 decrease in capacitance by an equal amount. Since the diode pairs are in series and in parallel with one another, the net result is a drop in capacitance equal to the drop in capacitance of one of the diodes because two capacitors in series with one another cause a drop in capacitance equal to one half of the capacitance of each of diode, while two diodes in parallel with one another have an additive affect in capacitance.

Figure 1:
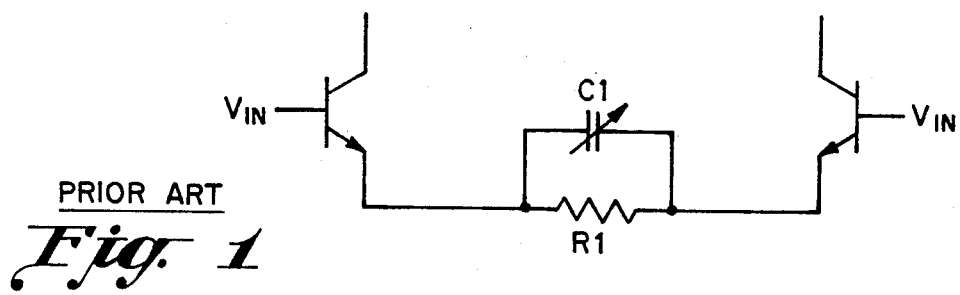
FIG. 1 is a schematic drawing of an input section of a transconductance amplifier known in the prior art.
Figure 2:
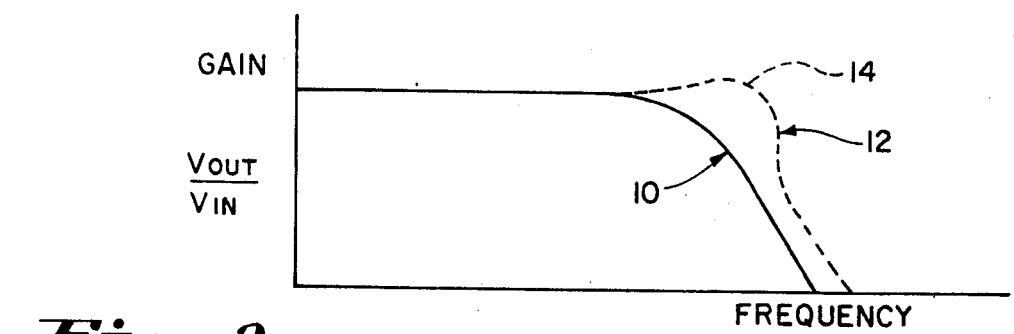
FIG. 2 is a frequency response curve which includes the FIG. 1 Amplifier.
Figure 5:
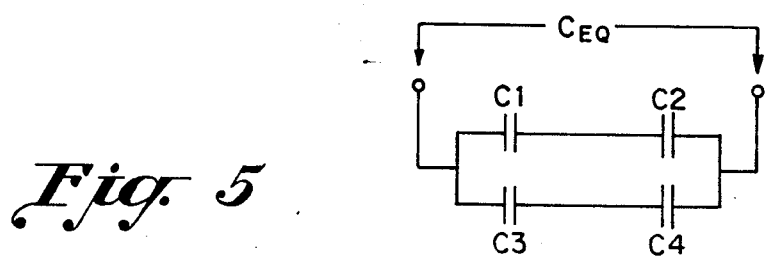
FIGS. 4–6 depict the equivalent circuits and responses of a portion of the FIG. 3 circuit.
Figure 6:
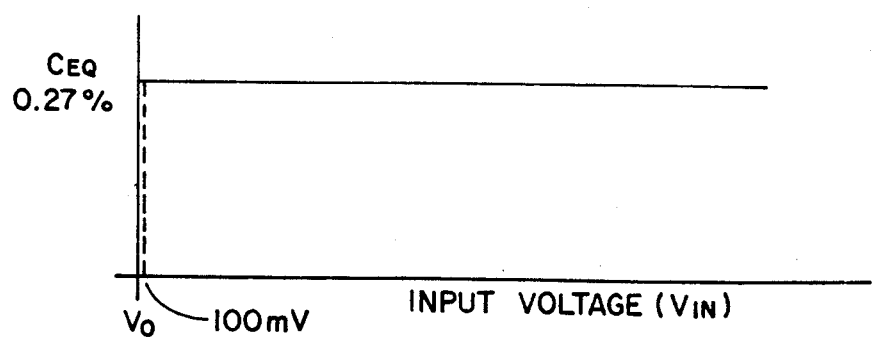
Figure 4:
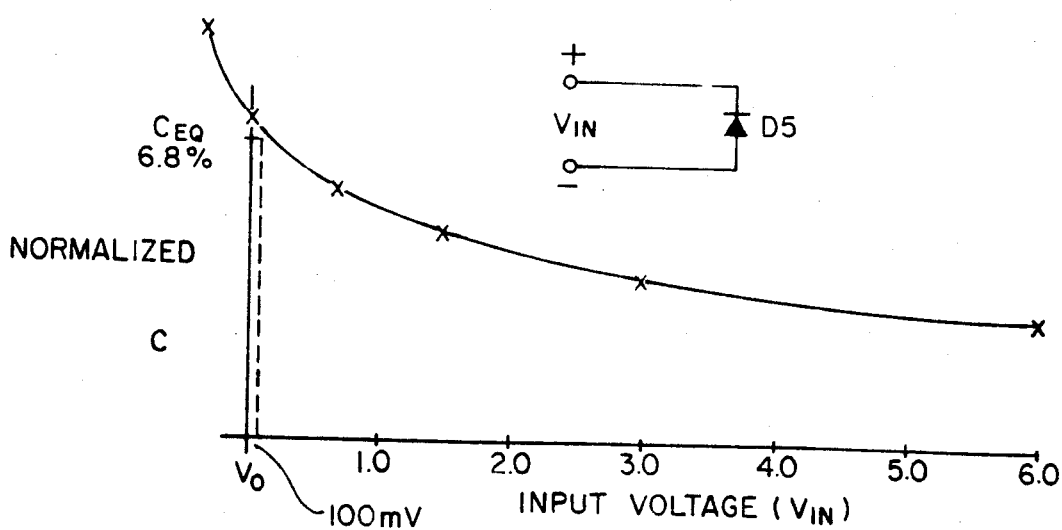

FIGS. 4–6 illustrate the signal independence of the controlled capacitor of the present invention. In general, the addition of a transfer function zero is desirable to increase bandwidth and an adjustable zero provides user external control of the bandwidth. FIG. 4 depicts the capacitance for a reversed bias diode. The capacitance is:

$$C = C_O \left( \frac{V_O}{V_{IN} + V_O} \right)^N$$

where $V_O$ is the built in potential and $C_O$ is the capacitance at $V_{IN}=0$.

FIG. 5 is an equivalent circuit of the reversed biased diodes in the FIG. 3 circuit. The equivalent capacitance, $C_{EQ}$, is:

$$C_{EQ} = \frac{1}{\frac{1}{C_O} + \frac{1}{C_O \left( \frac{V_O}{V_O - V_{IN}} \right)^x}} + \frac{1}{\frac{1}{C_O} + \frac{1}{C_O \left( \frac{V_O}{V_O + V_{IN}} \right)^x}}$$

FIG. 6 illustrates the independence of $C_{EQ}$ with changes in $V_{IN}$.

The invention is not limited to the particular details of the device depicted and other modifications and applications are contemplated. Certain other changes may be made in the above described device without departing from the true spirit and scope of the invention herein involved. For example, because the capacitance is independent of the applied signal, devices other than varactor diodes may be utilized in the present invention. It is intended therefore that the subject matter in the above depiction shall be interpreted as illustrative and not in a limiting sense.

What is claimed is:

1. A substantially constant capacitance circuit for use with an external circuit having a variable voltage signal across first and second terminals, said capacitance circuit comprising:
   first voltage means for supplying voltage having a positive terminal operatively connected to the first terminal;
   second voltage means for supplying a voltage having a positive terminal operatively connected to the second terminal;
   first, second, third and fourth reverse biased means for providing a voltage dependent capacitance, said first biased means connected across said first voltage means and said fourth biased means connected across said second voltage means, said second biased means connected from one side of said first voltage means to the opposed side of said second voltage means and said third biased means connected between said first and second voltage means in an opposite configuration to said second biased means, said first, second, third and fourth biased means connected to be reversed biased by said variable voltage signal and by said first and second voltage means;

wherein said substantially constant capacitance circuit provides a substantially constant equivalent capacitance across the first and second terminals of the external circuit as the level of the variable voltage signal changes.

2. The circuit described in claim 1 wherein said first and second voltage means are variable thereby providing adjustment of the equivalent capacitance provided to the first and second terminals.

3. A substantially constant capacitance circuit for use with an external circuit having a variable voltage signal across first and second terminals, said capacitance circuit comprising:

a first variable voltage source having its positive terminal operatively connected to the first terminal;

a second variable voltage source having its positive terminal operatively connected to the second terminal;

first, second, third and fourth reverse biased diodes, said first diode connected across said first voltage source and said fourth diode connected across second voltage source, said second diode connected from one side of said first voltage source to the opposed side of said second voltage source and said third diode connected between said first and second voltage sources in an opposite configuration to said second diode, said first, second, third and fourth diodes connected to be reversed biased by the variable voltage signal and by said first and second voltage sources;

wherein said substantially constant capacitance circuit provides a substantially constant equivalent capacitance across the first and second terminals of the external circuit as the level of the variable voltage signal changes.

4. A substantially constant capacitance for increasing the frequency of a transconductance amplifier having at least a circuit for producing an output current from an output voltage and having a predetermined gain, said circuit comprising:

means for receiving an input voltage and for producing the output voltage in response to said input voltage;

means for setting the gain of the transconductance amplifier and operatively connected to said means for receiving; and variable means for increasing the frequency response of the transconductance amplifier by providing a substantially constant capacitance across the means for setting the gain and operatively connected to said means for receiving and to said means for setting the gain and which is unaffected by changes in the level of said input voltage, said variable means for increasing the frequency response of the transconductance amplifier being voltage controlled comprising at least means for supplying a variable voltage.

5. A substantially constant capacitance for increasing the frequency of a transconductance amplifier having at least a circuit for producing an output current from an output voltage and having a predetermined gain, said circuit comprising:

means for receiving an input voltage and for producing the output voltage in response to said input voltage;

means for setting the gain of the transconductance amplifier and operatively connected to said means for receiving; and variable means for increasing the frequency response of the transconductance amplifier by providing a substantially constant capacitance across the means for setting the gain and operatively connected to said means for receiving and to said means for setting the gain and which is unaffected by changes in the level of said input voltage, said variable means for increasing the frequency response comprising at least four voltage controlled reverse biased diodes operatively connected in a series-parallel configuration.

6. A substantially constant capacitance for increasing the frequency of a transconductance amplifier having at least a circuit for producing an output current from an output voltage and having a predetermined gain, said circuit comprising:

means for receiving an input voltage and for producing the output voltage in response to said input voltage, said means for receiving having a positive input terminal for receiving said input voltage and a negative input terminal for receiving a reference voltage, operatively connected, respectively, to first and second semiconductor means for accepting the input voltage and reference voltage received on said positive and negative input terminals;

means for setting the gain of the transconductance amplifier and operatively connected to said means for receiving; and variable means for increasing the frequency response of the transconductance amplifier by providing a substantially constant capacitance across the means for setting the gain and operatively connected to said means for receiving and to said means for setting the gain and which is unaffected by changes in the level of said input voltage, said variable means for increasing the frequency response comprising a first variable voltage source operatively connected to said first semiconductor means and a second variable voltage source operatively connected to said second semiconductor means and first, second, third and fourth reverse biased diodes, said first diode connected across said first voltage source and said fourth diode connected across said second voltage source, said second diode connected from one side of said first voltage source to the opposed side of said second voltage source and said third diode connected between said first and second voltage sources in an opposite configuration to said second diode, said first, second, third and fourth diodes connected to be reversed biased by said input voltage, said reference voltage and said first and second voltage sources.

7. The circuit described in claim 6 wherein when said first and second voltage sources are changed in voltage level at substantially the same time the voltage level across each of said diodes is changed by substantially the same degree.

8. A substantially constant capacitance for increasing the frequency of a transconductance amplifier having at least a circuit for producing an output current from an output voltage and having a predetermined gain, said circuit comprising:

means for receiving an input voltage and for producing the output voltage in response to said input voltage, said means for receiving having a positive input terminal for receiving a positive portion of said input voltage and a negative input terminal for receiving a reference negative portion of said input voltage, operatively connected, respectively, to first and second semiconductor means for accepting the positive and negative portions of said input voltage received on said positive and negative input terminals;

means for setting the gain of the transconductance amplifier and operatively connected to said means for receiving; and variable means for increasing the frequency response of the transconductance amplifier by providing a substantially constant capacitance across the means for setting the gain and operatively connected to said means for receiving and to said means for setting the gain and which is unaffected by changes in the level of said input voltage, said variable means for increasing the frequency response comprising a first variable voltage source operatively connected to said first semiconductor means and a second variable voltage source operatively connected to said second semiconductor means and first, second, third and fourth reverse biased diodes, said first diode connected across said first voltage source and said fourth diode connected across said second voltage source, said second diode connected from one side of said first voltage source to the opposed side of said second voltage source and said third diode connected between said first and second voltage sources in an opposite configuration to said second diode, said first, second, third and fourth diodes connected to be reversed biased by said positive and negative portions of said input voltage and by said first and second voltage sources.

9. The circuit described in claim 8 wherein when said first and second voltage sources are changed in voltage level at substantially the same time the voltage level across each of said diodes is changed by substantially the same degree.

10. A substantially constant capacitance circuit for increasing the frequency response of a transconductance amplifier having at least a circuit for producing an output current from an output voltage and having a predetermined gain, said circuit comprising:

first semiconductor means for accepting an input voltage and producing the output voltage having a positive input terminal for receiving said input voltage;

second semiconductor means for accepting a reference voltage and also producing the output voltage having a negative input terminal for receiving said reference voltage, operatively connected by a gain setting resistor to said first semiconductor means;

first variable voltage source operatively connected to said first semiconductor means and second variable voltage source operatively connected to said second semiconductor means;

first, second, third and fourth reversed biased diodes, said first diode connected across said first voltage source and said fourth diode connected across said second voltage source, said second diode connected from one side of said first voltage source to the opposite side of said second voltage source and said third diode connected between said first and second voltage sources in an opposite configuration to said second diode, said first, second, third and fourth diodes connected to be reversed biased by said input voltage, said reference voltage and said first and second voltage sources, said voltage sources and said reversed biased diodes also being connected across said gain setting resistor.

11. A substantially constant capacitance circuit for increasing the frequency response of a transconductance amplifier having at least a circuit for producing an output current from an output voltage and having a predetermined gain, said circuit comprising:

first semiconductor means for accepting the positive portion of an input voltage and producing the output voltage, having a positive input terminal for receiving said positive portion of said input voltage;

second semiconductor means for accepting the negative portion of said input voltage and also producing the output voltage, having a negative input terminal for receiving said negative portion of said input voltage, operatively connected by a gain setting resistor to said first semiconductor means;

first variable voltage source operatively connected to said first semiconductor means;

second variable voltage source operatively connected to said second semiconductor means;

first, second, third and fourth reversed biased diodes, said first diode connected across said first voltage source and said fourth diode connected across said second voltage source, said second diode connected from one side of said first voltage source to the opposite side of said second voltage source and said third diode connected between said first and second voltage sources in an opposite configuration to said second diode, said first, second, third and fourth diodes connected to be reversed biased by said positive and negative portions of said input voltage and by said first and second voltage sources, said voltage sources and said reversed biased diodes also being connected across said gain setting resistor.

* * * * *